United States Patent [19]
Laskaris et al.

[11] Patent Number: 5,517,169
[45] Date of Patent: May 14, 1996

[54] SUPERCONDUCTING MAGNET WITH MAGNETIC SHIELDING

[75] Inventors: Evangelos T. Laskaris, Schenectady; Bizhan Dorri, Clifton Park; Madabushi V. Chari, Burnt Hills; Gerald B. Kliman, Niskayuna; Michele D. Ogle, Burnt Hills, all of N.Y.

[73] Assignee: General Electric Company, Schenectady, N.Y.

[21] Appl. No.: 323,649

[22] Filed: Oct. 17, 1994

[51] Int. Cl.⁶ .................................................. G01V 3/00
[52] U.S. Cl. ........................ 335/301; 335/216; 324/318; 324/319
[58] Field of Search ................................. 335/216, 301; 324/318, 319, 320

[56] References Cited

U.S. PATENT DOCUMENTS

| | | |
|---|---|---|
| 4,724,412 | 2/1988 | Kalafala . |
| 4,924,198 | 5/1990 | Laskaris . |
| 5,237,300 | 8/1993 | Ige et al. . |
| 5,291,169 | 3/1994 | Ige et al. . |
| 5,309,106 | 5/1994 | Miyajima et al. .................. 324/318 |

OTHER PUBLICATIONS

"Open MRI Magnet with Superconductive Shielding", by E. T. Laskaris, U.S. Patent Application Serial No. 08/260,433, filed Jun. 15, 1994.

Primary Examiner—Leo P. Picard
Assistant Examiner—Raymond M. Barrera
Attorney, Agent, or Firm—Douglas E. Erickson; Paul R. Webb, II

[57] ABSTRACT

A superconductive magnet with magnetic shielding has an annularly-cylindrical-shaped housing whose first end wall and outer cylindrical wall are magnetizable (e.g., iron) walls and whose inner cylindrical wall is a non-magnetizable wall. At least one main superconductive coil is positioned within the housing and carries an electric current in a first (e.g., clockwise) direction. An annular first permanent magnet is positioned outside the housing longitudinally proximate the first end wall. The first permanent magnet has a number of equivalent ampere turns and has a magnetic field direction oriented parallel to the axis pointing towards the second end wall so that its magnetic field longitudinally pulls the stray magnetic field of the superconductive coil(s), which leaves the magnet's bore, inward to be captured by the iron first end wall.

6 Claims, 2 Drawing Sheets

SUPERCONDUCTING MAGNET WITH MAGNETIC SHIELDING

BACKGROUND OF THE INVENTION

The present invention relates generally to a superconductive magnet used to generate a magnetic field, and more particularly to such a magnet having magnetic shielding to protect the area around the magnet from stray magnetic fields originating from the magnet.

Superconductive magnets are used in various fields such as in MRI (magnetic resonance imaging) medical diagnostics. Known superconductive magnets are cooled by liquid helium or by a cryocooler coldhead. Conventional superconductive magnets include closed and open magnets. A closed superconductive magnet has a single superconductive coil assembly with at least one generally solenoidal-shaped main superconductive coil spaced apart from and surrounded by a generally annularly-cylindrical-shaped housing having a bore, with at least one thermal shield interposed between the main superconductive coil(s) and the housing. An open superconductive magnet has two longitudinally spaced-apart superconductive magnet assemblies with each superconductive magnet assembly similar to a closed superconductive magnet. It is noted that the open space between the two superconductive magnet assemblies of an open MRI medical magnet helps relieve the patient of any claustrophobic feelings and provides the doctor with access to the patient for surgical procedures during MRI operation.

Medical MRI superconductive magnets are magnetically shielded to prevent the high magnetic field created by and surrounding the main superconductive coil(s) from adversely interacting with electronic equipment located in the vicinity of the magnet. Known techniques for magnetically shielding superconductive magnets include active and/or passive shielding. Active shielding techniques include employing superconductive shielding coils which are cooled by liquid helium or a cryocooler coldhead and which are located within the housing. The superconductive shielding coils carry electric current of generally equal amperage and opposite direction to the electric current carried by the main superconductive coil(s). The total number of ampere turns of the superconductive shielding coils is equal to or greater than generally one-third of the total number of ampere turns of the main superconductive coil(s). The superconductive shielding coils are positioned within the housing radially outward of the main superconductive coil(s) so that the magnetic field of the superconductive shielding coils opposes the magnetic field of the main superconductive coil(s) to magnetically shield the area outside the magnet. It is noted that, due to the presence of the superconductive shielding coils, the total number of ampere turns of the main superconductive coil(s) must be made much larger to achieve the desired magnetic field strength in the magnet's bore (i.e., the bore of the housing), as can be appreciated by those skilled in the art.

Passive shielding techniques include employing iron in the outer cylindrical wall of the housing to capture and contain the magnetic fields generated by the main superconductive coil(s) so that such magnetic fields stay within the housing. A closed magnet would also employ iron in the two longitudinally spaced-apart end walls of the housing, while an open magnet would also employ iron in the longitudinally outer end wall of the housing for each of the two superconductive magnet assemblies. It is noted that an open magnet would further require an iron shield for the open space between the two superconductive magnet assemblies. However, closing the open space between the two superconductive magnet assemblies of an open magnet with an iron magnetic shield would eliminate the very advantages of the open magnet design.

Known superconductive magnet installations have included unshielded superconductive magnets sited in rooms having iron or resistive shielding coils located in the room walls to magnetically shield the areas outside the room.

What is needed is a superconductive magnet with improved magnetic shielding. The magnetic shielding must not require the increase in ampere turns for the main superconductive coil(s) or the use of extreme cooling measures as required when using superconductive shielding coils, and the magnetic shielding must not require the full size and weight of iron as required when using a conventional iron housing.

SUMMARY OF THE INVENTION

It is an object of the invention to provide a superconductive magnet with improved magnetic shielding.

The superconductive magnet of the invention includes a generally longitudinally extending axis, a generally annularly-cylindrical-shaped housing, a superconductive coil assembly, and a generally annular first permanent magnet. The housing is generally coaxially aligned with the axis, has annular, longitudinally-spaced-apart first and second end walls, and has radially-spaced-apart outer and inner cylindrical walls. The first end wall and the outer cylindrical wall are generally magnetizable (e.g., iron) walls, and the inner cylindrical wall is a generally non-magnetizable wall. The superconductive coil assembly has at least one generally solenoidal-shaped main superconductive coil which is generally coaxially aligned with the axis, which is located within and generally spaced apart from the housing, and which has a number of ampere turns. The first permanent magnet is generally coaxially aligned with the axis, positioned outside the housing longitudinally proximate the first end wall, has a number of equivalent ampere turns, and has a magnetic field direction oriented generally parallel to the axis pointing towards the second end wall.

Several benefits and advantages are derived from the invention. The size and weight of the generally magnetizable (e.g., iron) outer cylindrical wall and first end wall is reduced from that of a conventional iron housing due to the presence of the first permanent magnet. The stray magnetic field generated by the main superconductive coil(s), which is not captured by the longitudinally-shortened outer cylindrical wall and first end wall of the invention, leaves the bore of the housing. Such stray magnetic field then passes by the first end wall in a generally radially outward direction. The magnetic field of the first permanent magnet magnetically pulls such stray magnetic field longitudinally inward into the generally magnetizable (e.g., iron) first end wall where it is captured. It is noted that the first permanent magnet is not a superconductive coil and therefore does not require extreme cooling measures. It is also noted that the first permanent magnet is located outside the housing proximate the generally magnetizable (e.g., iron) first end wall. Therefore, the main superconductive coil(s) do not need to have the total number of ampere turns appreciably increased to achieve the desired magnetic field strength in the magnet's bore.

BRIEF DESCRIPTION OF THE DRAWINGS

The accompanying drawings illustrates two preferred embodiments of the present invention wherein.

DETAILED DESCRIPTION OF THE INVENTION

Figure 1:
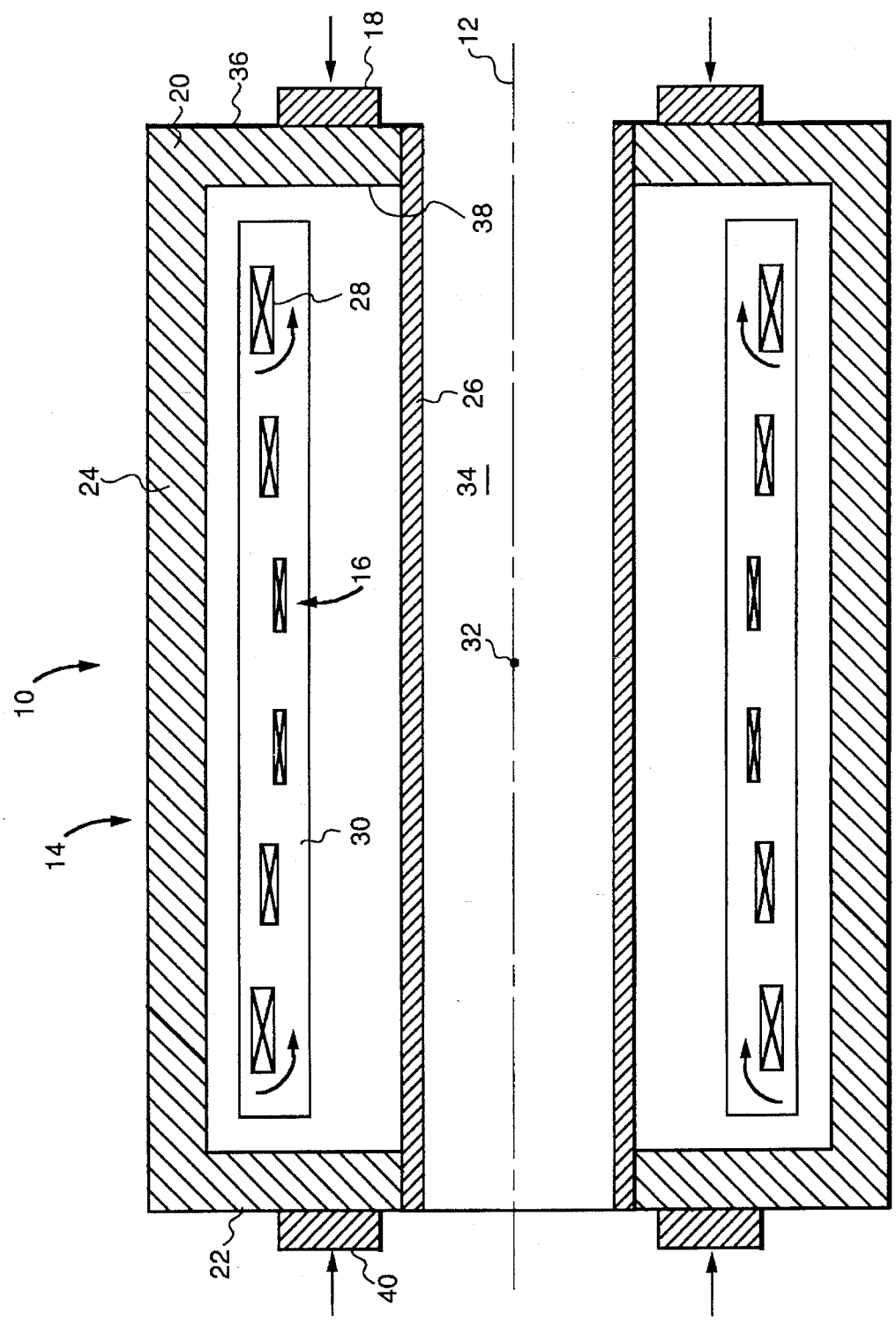
FIG. 1 is a schematic cross-sectional side-elevational view of a closed superconductive magnet of the present invention.

Referring now to the drawings, wherein unnumbered arrows indicate magnetic field direction, FIG. 1 shows a first preferred embodiment of the superconductive magnet 10 of the present invention. The magnet 10 includes a generally longitudinally extending axis 12, a generally annularly-cylindrical-shaped housing 14, a superconductive coil assembly 16, and a generally annular first permanent magnet 18.

The housing 14 is generally coaxially aligned with the axis 12, has annular, longitudinally-spaced-apart first and second end walls 20 and 22, and has radially-spaced-apart outer and inner cylindrical walls 24 and 26. In a preferred construction, the end walls 20 and 22 and the cylindrical walls 24 and 26 are hermetically connected together to define a vacuum enclosure. The first end wall 20 and the outer cylindrical wall 24 are generally magnetizable walls, and the inner cylindrical wall 26 is a generally non-magnetizable wall. In another preferred construction, the first end wall 20 and the outer cylindrical wall 24 are added on to a separate vacuum enclosure (not shown in the figures). It is seen from FIG. 1, that magnet 10 is a closed magnet wherein the housing 14 is a closed-magnet housing. For a magnet 10 which is a closed magnet, the second end wall 22 is a generally magnetizable wall. Preferably, a magnetizable wall is made of ferromagnetic material, although other more exotic magnetizable materials are known to those skilled in the art. In a preferred embodiment, the first and second end walls 20 and 22, and the outer cylindrical wall 24 consist essentially of iron. It is noted that the end walls 20 and 22 and the outer cylindrical wall 24 preferably are connected together, such as, for example, by being formed together as a single member or by being separately-formed as separate members which are attached together. Preferably, the non-magnetizable inner cylindrical wall 26 consists essentially of non-magnetizable stainless steel.

The superconductive coil assembly 16 has at least one generally solenoidal-shaped main superconductive coil 28. The at least one main superconductive coil 28, seen in FIG. 1, has six such coils which are referred to together, and numerically referenced together, as the at least one main superconductive coil 28. The at least one main superconductive coil 28 is generally coaxially aligned with the axis 12 and is disposed within and generally spaced apart from the housing 14. The at least one main superconductive coil 28 has a number of ampere turns and carries an electric current generally in a first direction. The first direction is defined to be either a clockwise or a counterclockwise circumferential direction about the axis 12 with any slight longitudinal component of current direction being ignored. In an exemplary embodiment, the at least one main superconductive coil 28 comprises niobium-tin superconductive tape or wire. Preferably, the at least one main superconductive coil 28 is supported by a coil form 30 which is supported by thermally insulating spacer tubes and/or tie rod straps (not shown in the figures) from the housing 14. It is noted, from FIG. 1, that a midpoint 32 located on the axis 12 longitudinally halfway between the end walls 20 and 22 would lie in the bore 34 of the housing 14 (i.e., the magnet's bore) and typically would lie at the center of an MRI imaging volume (not shown).

For a superconductive magnet cooled by a cryocooler coldhead (such as that of a conventional Gifford McMahon cryocooler), a thermal shield (omitted from the figures for clarity) would be disposed between and spaced apart from the superconductive coil assembly 16 and the housing 14 with the coldhead's first stage (having a temperature of generally 40 Kelvin) in thermal solid-conductive contact with the thermal shield and with the coldhead's second stage (having a temperature of generally 10 Kelvin) in thermal solid-conductive contact with the at least one main superconductive coil. For a superconductive magnet cooled by liquid helium, the superconductive coil assembly 16 would be placed in the liquid helium container within the housing 14 and two spaced-apart thermal shields would be disposed between and spaced apart from the liquid helium container and the housing (such liquid helium container and thermal shields omitted from the figures for clarity).

The first permanent magnet 18 is generally coaxially aligned with the axis 12 and is disposed outside the housing 14 longitudinally proximate the first end wall 20. The first permanent magnet 18 has a number of equivalent ampere turns and has a magnetic field direction oriented generally parallel to the axis 12 pointing towards the second end wall 22. Preferably, the number of equivalent ampere turns of the first permanent magnet 18 is less than generally one-tenth the number of ampere turns of the at least one main superconductive coil 28. Preferably, as seen from FIG. 1, the first permanent magnet 18 is radially disposed closer to the inner cylindrical wall 26 than to the outer cylindrical wall 24 and is connected to the first end wall 20. The first end wall 20 includes an outer annular surface 36 and an inner annular surface 38, with the first permanent magnet 18 connected to the outer annular surface 36. In a preferred embodiment, the first permanent magnet 18 comprises a ferrite magnet, although other more exotic permanent-magnet materials are known to those skilled in the art.

In a closed-magnet design, as seen in FIG. 1, the magnet 10 would further include a generally annular second permanent magnet 40 generally coaxially aligned with the axis 12 and disposed outside the housing 14 longitudinally proximate the second end wall 22. The second permanent magnet 40 has a number of equivalent ampere turns and has a magnetic field direction oriented generally parallel to the axis 12 pointing towards the first end wall 20. The number of equivalent ampere turns of the second permanent magnet 40 is generally equal to the number of equivalent ampere turns of the first permanent magnet 18. In a preferred closed-magnet design, the first and second permanent magnets 18 and 40 are generally identical to each other and are disposed in mirror-image fashion about a plane which is perpendicular to the axis 12 and which passes through the midpoint 32.

In operation, the stray magnetic field of the at least one main superconductive coil 28, which is not captured by the magnetizable first end wall 20, exits the bore 34 to pass radially outward past the first end wall 20. The first permanent magnet 18 is disposed to have its magnetic field deflect such exiting stray magnetic field longitudinally inward to be captured by the magnetizable first end wall 20. The exiting stray magnetic field is said to be deflected because the magnetic field vector of the first resistive deflection coil 18 is added to it. To keep the stray magnetic field within the magnetizable second end wall 22, the second permanent magnet 40 is disposed to counteract the undesirable "spill-over" influence of the main superconductive coil(s) located near the second end wall 22.

Applicants have designed (but have yet to build) a magnet similar to the magnet 10 seen in FIG. 1. Applicants designed the magnet using the principles of the present invention, previously disclosed herein, together with conventional magnetic field analysis, as is within the skill of the artisan. For a 1.5 Tesla magnet and a desired level of magnetic shielding, the housing 14 used 18,000 pounds of iron and was longer than 2.0 meters without the permanent magnets 18 and 40 of the invention, but used 16,000 pounds of iron and was 1.9 meters long with the permanent magnets 18 and 40 of the invention. Each permanent magnet 18 and 40 was one inch thick, used 325 pounds of ferrite material, and was rated as having 2400 equivalent ampere turns. It is noted that the at least one main superconductive coil 28 has its total number of ampere turns increased by less than 5% due to the presence of the resistive deflection coils 18 and 40. It is further noted that if superconductive shielding coils were used in place of the iron, the at least one main superconductive coil 28 would have to increase its number of ampere turns by about 50% and the number of ampere turns of the superconductive shielding coils would be about half that of the main superconductive coils.

Figure 2:
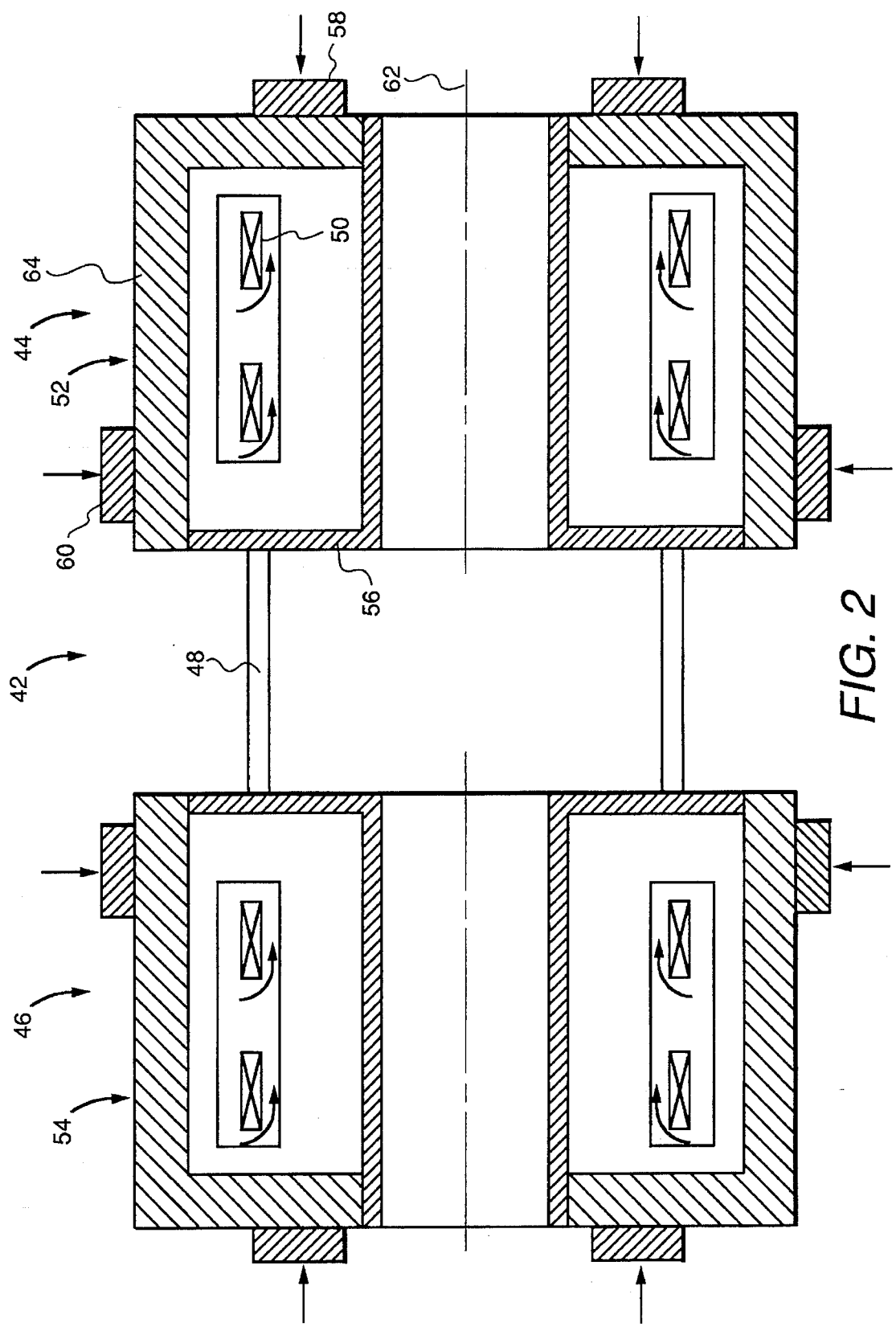
FIG. 2 is a schematic cross-sectional side-elevational view of an open superconductive magnet of the present invention.

Referring again to the drawings, FIG. 2 shows a second preferred embodiment of the superconductive magnet 42 of the present invention. Magnet 42 is an open magnet having two magnet assemblies 44 and 46 longitudinally spaced-apart by generally parallel structural posts 48 to create an intervening open space. Magnet assembly 46 is a generally mirror image of magnet assembly 44 about a plane oriented generally perpendicular to the structural posts 48 and disposed generally equidistant from the magnet assemblies 44 and 46. Magnet assembly 44 is generally identical to magnet 10 of FIG. 1 with differences as hereinafter noted. The at least one main superconductive coil 50 of magnet assembly 44 has two (instead of six) such coils. The housing 52 of magnet assembly 44 is an open-magnet (instead of a closed-magnet) housing. It is noted that when the housings are vacuum enclosures, housing 52 of magnet assembly 44 preferably is hermetically connected to the housing 54 of magnet assembly 46 through the structural posts 48 (such detailed design being omitted from the drawings for clarity). The second (i.e., longitudinally inward facing) end wall 56 of the housing 52 of magnet assembly 44 is a generally non-magnetizable (instead of a magnetizable) wall. It is also noted that the generally annular second permanent magnet 60 is generally coaxially aligned with the axis 62 and has a number of equivalent ampere turns. However, the second permanent magnet 60 is disposed outside the housing 52 radially proximate the outer cylindrical wall 64 (and not longitudinally proximate the second end wall 56) and has a magnetic field direction oriented generally perpendicular to the axis 62 pointing towards the axis 62 (and not oriented parallel to the axis 62 pointing towards the second end wall 56). The number of equivalent ampere turns of the second permanent magnet 60 is greater than (and not generally equal to) the number of equivalent ampere turns of the first permanent magnet 58, as can be appreciated by those skilled in the art. To keep the stray magnetic field within the magnetizable outer cylindrical wall 64 in the vicinity of the second end wall 56, the second permanent magnet 60 is disposed to counteract the undesirable "spill-over" influence of the main superconductive coil(s) located near the second end wall 56. Finally, the MRI imaging volume (not shown) would lie in the open space between the two magnet assemblies 44 and 46 (and not within a magnet assembly 44 or 46).

The foregoing description of a preferred embodiment of the invention has been presented for purposes of illustration. It is not intended to be exhaustive or to limit the invention to the precise form disclosed, and obviously many modifications and variations are possible in light of the above teaching. For example, the generally annular permanent magnets 18, 40, 58, and 60 may each be a single magnet having a generally annular shape or may each comprise a plurality of sub-magnets arranged in a (spaced-apart or touching) generally annular array. It is intended that the scope of the invention be defined by the claims appended hereto.

We claim:

1. A closed superconductive magnet comprising:

a) a generally longitudinally extending axis;

b) a generally annularly-cylindrical-shaped housing generally coaxially aligned with said axis, having annular, longitudinally-spaced-apart first and second end walls, and having radially-spaced-apart outer and inner cylindrical walls, wherein said first and second end walls and said outer cylindrical wall are generally magnetizable walls, and wherein said inner cylindrical wall is a generally non-magnetizable wall;

c) a superconductive coil assembly having at least one generally solenoidal-shaped main superconductive coil which is generally coaxially aligned with said axis, which is disposed within and generally spaced apart from said housing, and which has a number of ampere turns;

d) a generally annular first permanent magnet generally coaxially aligned with said axis, disposed outside said housing longitudinally proximate said first end wall, having a number of equivalent ampere turns, and having a magnetic field direction oriented generally parallel to said axis pointing towards said second end wall whereby stray magnetic field from said superconductive coil assembly passing radially by said first permanent magnet is deflected toward and captured by said first end wall; and e) a generally annular second permanent magnet generally coaxially aligned with said axis, disposed outside said housing longitudinally proximate said second end wall, having a number of equivalent ampere turns, and having a magnetic field direction oriented generally parallel to said axis pointing towards said first end wall whereby stray magnetic field from said superconductive coil assembly passing radially by said second permanent magnet is deflected toward and captured by said second end wall.

2. The closed magnet of claim 1, wherein said number of equivalent ampere turns of said second permanent magnet is generally equal to said number of equivalent ampere turns of said first permanent magnet and wherein said number of equivalent ampere turns of said first permanent magnet is less than generally one-tenth of said number of said ampere turns of said at least one main superconductive coil.

3. An open superconductive magnet comprising:

a) a generally longitudinally extending axis;

b) a plurality of spaced-apart, generally parallel, and generally longitudinally extending structural posts; and c) two generally identical magnet assemblies disposed in mirror image relationship about a plane oriented generally perpendicular to said structural posts and positioned generally equidistant from said magnet assemblies, wherein said magnet assemblies are longitudinally spaced-apart by said structural posts to create an intervening open space, and wherein each said magnet assembly includes:

(1) a generally annularly-cylindrical-shaped housing generally coaxially aligned with said axis, having annular, longitudinally-spaced-apart first and second end walls with said second end wall facing outwardly generally toward said open space, and having radially-spaced-apart outer and inner cylindrical walls, wherein said first end wall and said outer cylindrical wall are generally magnetizable walls, and wherein said second end wall and said inner cylindrical wall are generally non-magnetizable walls;

(2) a superconductive coil assembly having at least one generally solenoidal-shaped main superconductive coil which is generally coaxially aligned with said axis, which is disposed within and generally spaced apart from said housing, and which has a number of ampere turns; and (3) a generally annular first permanent magnet generally coaxially aligned with said axis, disposed outside said housing longitudinally proximate said first end wall, having a number of equivalent ampere turns, and having a magnetic field direction oriented generally parallel to said axis pointing towards said second end wall.

4. The open magnet of claim 3, wherein each said magnet assembly also includes:

(4) a generally annular second permanent magnet generally coaxially aligned with said axis, disposed outside said housing radially proximate said outer cylindrical wall and longitudinally proximate said second end wall, having a number of equivalent ampere turns, and having a magnetic field direction oriented generally perpendicular to said axis pointing towards said axis.

5. The open magnet of claim 4, wherein said number of equivalent ampere turns of said second permanent magnet is greater than said number of equivalent ampere turns of said first permanent magnet.

6. An open superconductive magnet comprising:

a) a generally longitudinally extending axis;

b) a plurality of spaced-apart, generally parallel, and generally longitudinally extending structural posts; and c) two generally identical magnet assemblies disposed in mirror image relationship about a plane oriented generally perpendicular to said structural posts and positioned generally equidistant from said magnet assemblies, wherein said magnet assemblies are longitudinally spaced-apart by said structural posts to create an intervening open space, and wherein each said magnet assembly includes:

(1) a generally annularly-cylindrical-shaped housing generally coaxially aligned with said axis, having annular, longitudinally-spaced-apart first and second end walls with said second end wall facing outwardly generally toward said open space, and having radially-spaced-apart outer and inner cylindrical walls, wherein said first end wall and said outer cylindrical wall are generally magnetizable walls, and wherein said second end wall and said inner cylindrical wall are generally non-magnetizable walls;

(2) a superconductive coil assembly having at least one generally solenoidal-shaped main superconductive coil which is generally coaxially aligned with said axis, which is disposed within and generally spaced apart from said housing, and which has a number of ampere turns; and (3) a generally annular permanent magnet generally coaxially aligned with said axis, disposed outside said housing radially proximate said outer cylindrical wall and longitudinally proximate said second end wall, having a number of equivalent ampere turns, and having a magnetic field direction oriented generally perpendicular to said axis pointing towards said axis.

* * * * *